MONOLITHIC CRYSTAL FILTER HAVING MASS LOADING ELECTRODE PAIRS HAVING AT LEAST ONE ELECTRICALLY NONCONDUCTIVE ELECTRODE

Filed Oct. 22, 1968

INVENTOR
CARL R. HURTIG
BY
Kenway, Jenney & Hildreth
ATTORNEYS

United States Patent Office 3,544,926
Patented Dec. 1, 1970

3,544,926

MONOLITHIC CRYSTAL FILTER HAVING MASS LOADING ELECTRODE PAIRS HAVING AT LEAST ONE ELECTRICALLY NONCONDUCTIVE ELECTRODE

Carl R. Hurtig, Scituate, Mass., assignor to Damon Engineering, Inc., Needham Heights, Mass., a corporation of Massachusetts Filed Oct. 22, 1968, Ser. No. 769,502
Int. Cl. H03h *7/10;* H01v *7/00*
U.S. Cl. 333—72 2 Claims

ABSTRACT OF THE DISCLOSURE

The specification describes an improved monolithic crystal filter comprising three or more resonators in which at least one of the internal electrodes which define the resonators and fix their parameters is composed of an electrically nonconductive material, such as silicon monoxide. Substitution of such a nonconductor for the metal used in previously-known monolithic crystal filters greatly increases the maximum possible bandwidth of a filter, thus removing an important limitation on its flexibility and performance.

BACKGROUND OF THE INVENTION

This invention relates generally to piezoelectric crystal filters and, more specifically, to an improved monolithic crystal filter.

It is known that piezoelectric crystals may be employed as resonators in electric wave filters to select or reject a specific narrow band of freqencies from a broad band containing desired and undesired frequencies. A "conventional" crystal filter typically consists of a number of crystals, inductors and tranformers, and fixed and variable capacitors. These components are normally mounted on an insulating board and interconnected by means of wires or etched circuitry. Each crystal is usually hermetically sealed in its own enclosure, and is treated as a discrete electrical component of the crystal filter assembly. A type of quartz crystal that is currently in common usage at frequencies above one megahertz is the so-called AT-cut, thickness-shear resonator. This device consists of a thin plate of single-crystalline quartz with a metallic electrode deposited over a central portion of each surface. As used herein, the term "crystal plate" or "plate" means a thin wafer cut from a quartz crystal in a certain way, that is, in an AT-cut. This manner of cutting is well-known in the art; see, for example, W. D. Beaver, Theory and Design Principles of the Monolithic Crystal Flter (University Microfilms, Ann Arbor, Mich., 1968). The term "major surface" or "surface" when referring to a crystal wafer means one of the two large, opposed, planar faces of the wafer. The "active area" of an AT-cut crystal is located primarily beneath the electrodes, and extends outward from the edges of the electroded area with an exponentially decaying amplitude, obeying the "energy trapping" principle. The resonant freqency of an AT-cut resonator is determined primarily by the thickness of the quartz plate and to a lesser extent by the mass-loading of the electrodes.

A fairly recent development in the field of crystal filter technology has been the fabrication of the so-called "monolithic" crystal filter, or MCF. The MCF is a multi-resonator device consisting of one or more quartz plates, each of which contains two or more acoustically coupled resonators, each resonator being defined by an opposed pair of metallic electrodes. This acoustic coupling is known to exist between any two electrode regions located in proximity on a single AT-cut quartz plate. Any number of resonators can be coupled in this way on a single plate, and such a plate performs basically in the same way as a series of electrically interconnected quartz resonators. The MCF, however, offers several distinct advantages over the electrically-coupled series of resonators, among which are a major reduction in volume and improved reliability through reduction in complexity. It is with the second of these advantages that this invention is concerned.

Since the coupling in an MCF is acoustical, carried out through the crystal itself, there is no need for electrical inter-connection among the resonators. The only electrical connection necessary is between each "external" electrode pair and the portion of the circuit in which the filter is being utilized. By "external" electrode pair is meant an electrode pair which as the input to or the output from the entire crystal filter. That is to say, if the filter is enclosed in a "black box," one external electrode pair will serve as the input to the filter, while another external electrode pair will serve as the output. The remaining electrode pairs of the crystal filter will be referred to herein as "internal" electrode pairs. Since this invention is concerned only with internal electrode pairs, it necessarily is limited in application to those monolithic filters which are comprised of three or more resonators.

My invention is an improved monolithic crystal filter in which at least one of the internal electrodes is composed of an electrically non-conductive material, such as silicon monoxide. Whereas previously known MCF's have used metal electrodes, which contribute to an undesirable static capacitance, as described hereinafter, my apparatus eliminates this capacitance.

The principal object of this invention is to remove the limitation on the maximum possible bandwith of a monolithic crystal filter by eliminating the static capacitance of the internal metal electrodes.

Other objects of the invention will in part be obvious and will in part appear hereinafter.

The invention accordingly comprises the features of construction, combination of elements, and arrangement of parts which will be exemplified in the construction hereinafter set forth, and the scope of the invention will be indicated in the claims.

BRIEF DESCRIPTION OF THE DRAWINGS

For a fuller understanding of the nature and objects of my invention, reference should be had to the following detailed description taken in connection with the accompanying drawings, in which.

GENERAL DESCRIPTION OF THE INVENTION

Figure 1:
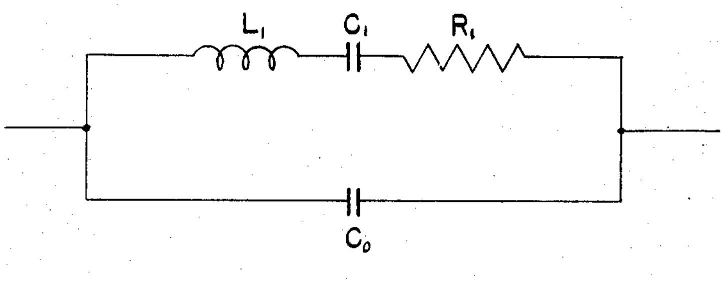
FIG. 1 shows an equivalent electrical circuit for a crystal resonator.

It is well-known in the art, that in the vicinity of a resonant frequency, a crystal resonator may be represented by the equivalent electrical circuit shown in FIG. 1. The inductances $L_1$ and the capacitance $C_1$ represent the effective mass and stiffness of the crystal, respectively. $C_0$ is the static capacitance and includes the stray wiring and electrode-pair capacitance as well as various other minor sources of capacitance. The resistance $R_1$ represents the frictional loss of the vibrating crystal. The crystal Q is defined as the ratio of the reactance of $L_1$ at the resonant frequency to the resistance $R_1$. Because of the extremely large value of Q, normally in the range of 10,000 to 200,000, the crystal may be considered a purely reactive network for most filter applications.

Figure 2:
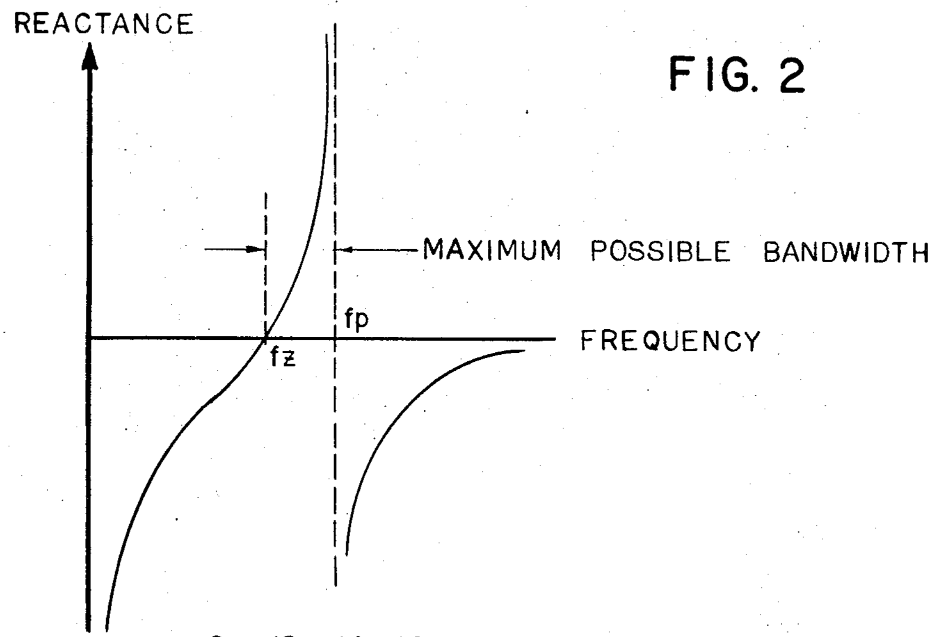
FIG. 2 shows the reactance curve for the equivalent circuit of FIG. 1, assuming the circuit is lossless.

The reactance curve corresponding to the lossless equivalent circuit of FIG. 1 is shown in FIG. 2. The resonant frequency or "zero" of the crystal unit, $f_z$, and the anti-resonant frequency or "pole," $f_p$, are related to one another by the ratio of capacitances of the crystal, defined by $r=C_0/C_1$. Analysis of the circuit shows that $$f_z=1/(2\pi)\sqrt{1/(C_1L_1)}$$

and that $$f_p=1/(2\pi)(C_0+C_1)/(L_1C_1C_0)$$

The pole and zero frequencies are related by:

$$(f_p-f_z)/f_z=\sqrt{1+1/r}-1$$

For resonators commonly used at present, $r$ is on the order of 250. Assuming $r\gg1$, the foregoing equation can be approximated as: $(f_p-f_z)/f_z=1/(2r)$. Thus the maximum possible bandwidth of a crystal filter, $(f_p-f_z)$, depends inversely on $r$, the ratio of the static to motional capacitances of the filter. Since the maximum possible bandwidth is an undesirable limitation of a filter system, it is an object of this invention to increase the potential bandwidth by reducing $r$. This is done by reducing the static capacitance, $C_0$.

In the conventional, as opposed to monolithic, crystal filter, it is necessary that all of the electrodes be composed of an electrically conductive material so that the required electrical connectors can be provided between individual resonators. In the MCF, however, what I have heretofore referred to as internal electrodes are not really electrodes at all, for no electrical connections are made to them, the resonator-to-resonator coupling being provided acoustically through the crystal itself. The only purpose of these "electrodes" is to define the parameters of the various resonators. This is done by mass-loading the resonators by means of metallic deposits. The mass of the deposits, along with the geometry and the properties of the crystal, fix the resonant frequency of the resonator. The filter bandwidth is determined by the geometry and spacing of the deposits as well as their mass. Since electrically non-conductive "electrodes" can define the resonator and specify its characteristics, and since there is no electrical interconnection necessary between "electrodes," these surface deposits can be composed of non-conductive material. Such non-conductive electrodes have the advantage over electrodes of conductive material that they do not contribute to the static capacitance $C_0$. In fact, since the only other significant factor which contributes toward this static capacitance is the wiring, and since in an MCF there is no wiring necessary to interconnect the resonators, substitution of non-conducting for conducting electrodes eliminates $C_0$ almost entirely. Thus $r$, the ratio of static to motional capacitance, no longer has any meaning and the maximum possible bandwidth of the crystal resonator is not constrained. Hence, an important limitation on the performance of an MCF is removed. This does not mean that the maximum possible bandwidth is entirely unlimited, for other factors will prevent it from growing infinitely large; it does mean that a designer will enjoy greater latitude in choosing the bandwidth he wishes a given crystal filter to exhibit. This represents an important improvement in crystal technology, for crystal filters now in use exhibit such very narrow bandwidths and conventional LC filters exhibit such wide ones that there has been a wide range of unattainable bandwidths between the two. The present invention will narrow this gap.

Figure 3:
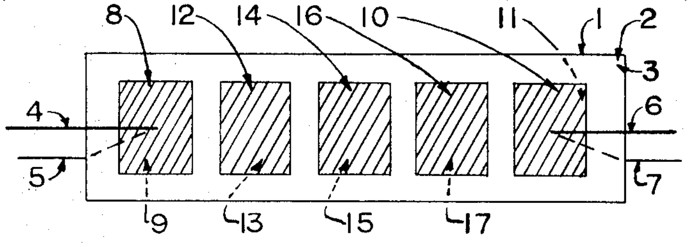
FIGS. 3 and 4 are a plan view and an elevation view, respectively, of a monolithic crystal filter incorporating the features of this invention.
Figure 4:
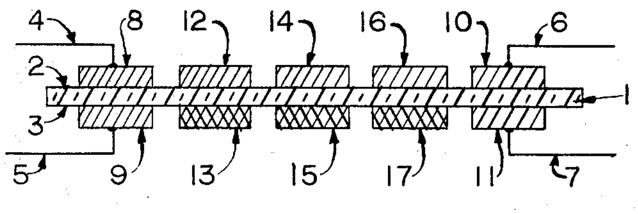

FIGS. 3 and 4 show a plan and elevation view respectively of a preferred embodiment of an MCF incorporating my invention. An AT-cut crystal plate 1 has major surfaces 2 and 3. The input leads 4 and 5 and the output leads 6 and 7, which serve to connect the filter with the circuit in which it is used, are electrically connected to the crystal plate's external electrodes 8, 9, 10 and 11 respectively. These four electrodes are of the usual conductive material. The internal electrodes 12, 14 and 16 are also composed of conductive material. The corresponding opposed internal electrodes 13, 15 and 17 respectively, are composed of non-conductive material, such as silicon dioxide. These internal electrodes serve only to define the various resonators and fix the parameters of each, the coupling between resonators being provided acoustically through the crystal plate.

In the preferred embodiment of this invention, silicon monoxide is chosen because it is a good electrical insulator. Furthermore, it can easily be made to adhere to quartz, which is silicon dioxide, or $SiO_2$. The opposing electrode of each internal pair is made, as before, of metal, usually silver, gold, nickel, or aluminum. The reason that only one electrode of each internal pair is composed of silicon monoxide is that the fabrication techniques employed in making MCF's are better suited to metals than to other materials. Mass-loading, for example, is accomplished by depositing a pre-determined amount of metal on the crystal surface. In order to assure that the crystal will possess the desired parameters, it is necessary that the amount of metal deposited be controlled with great precision, and it has been found that metallic deposition can be controlled with much greater accuracy than can non-metallic deposition. With respect to the static capacitance of a resonator, the effect of replacing only one conductive electrode with a non-conductive one is, of course the same as that of replacing both electrodes with non-conductive ones; in either case the new electrodes do not contribute at all toward a static capacitance. A second advantage of replacing only one of the electrodes is that the remaining metal electrode can be electrically connected to external devices, such as frequency meters, for testing during fabrication of the filter.

It will thus be seen that the objects set forth above, among those made apparent from the preceding description, are efficiently attained and, since certain changes may be made in the above construction without departing from the scope of the invention, it is intended that all matter contained in the above description or shown in the accompanying drawing shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

Having described my invention, what I claim as new and desire to secure by Letters Patent is:

1. In a monolithic crystal filter comprising a piezoelectric crystal plate and at least three opposed electrode pairs located on the major surfaces of the crystal plate, each of the resonators being acoustically coupled to each of the other of said resonators, the improvement which comprises making at least one of the electrodes of each electrode pair of an electrically non-conductive material.

2. Apparatus as defined in claim 1 wherein said piezoelectric crystal plate is composed of quartz and said non-conductive material is silicon monoxide.

References Cited

UNITED STATES PATENTS

| | | | |
|---|---|---|---|
| 3,015,789 | 1/1962 | Honda et al. | 310—8.2X |
| 3,437,848 | 4/1969 | Borner et al. | 310—8.2 |

HERMAN KARL SAALBACH, Primary Examiner

T. VEZEAU, Assistant Examiner

U.S. Cl. X.R.

310—8.2